United States Patent
Watts et al.

(10) Patent No.: US 7,279,113 B2
(45) Date of Patent: Oct. 9, 2007

(54) METHOD OF FORMING A COMPLIANT TEMPLATE FOR UV IMPRINTING

(75) Inventors: Michael P. C. Watts, Austin, TX (US); Ronald D. Voisin, Fremont, CA (US); Sidlgata V. Sreenivasan, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 11/298,244

(22) Filed: Dec. 9, 2005

(65) Prior Publication Data

US 2006/0096949 A1  May 11, 2006

Related U.S. Application Data

(62) Division of application No. 10/833,240, filed on Apr. 27, 2004, now Pat. No. 7,140,861.

(51) Int. Cl.
 *B44C 1/22* (2006.01)

(52) U.S. Cl. .............. 216/41; 216/2; 216/39; 216/54; 216/66; 430/311; 430/312

(58) Field of Classification Search .............. 216/2, 216/41, 39, 54; 430/311–312
See application file for complete search history.

(56) References Cited

U.S. PATENT DOCUMENTS 3,677,178 A * 7/1972 Gipe ............... 101/450.1
6,743,368 B2 * 6/2004 Lee ...................... 216/2
6,808,646 B1 * 10/2004 Jeans .................. 216/54

* cited by examiner

*Primary Examiner*—Shamim Ahmed
(74) *Attorney, Agent, or Firm*—Michael D. Carter; Fish & Richardson P.C.

(57) ABSTRACT

A method of forming a lithographic template having an elastomer layer positioned between a body and an imprinting layer, the imprinting layer having a pattern formed thereon.

12 Claims, 5 Drawing Sheets

METHOD OF FORMING A COMPLIANT TEMPLATE FOR UV IMPRINTING

CROSS-REFERENCE TO RELATED PATENT APPLICATION

The present application is a divisional patent application of U.S. patent application Ser. No. 10/833,240, now U.S. Pat. No. 7,140,861, filed on Apr. 27, 2004 and entitled "Compliant Hard Template for UV Imprinting," and listing Michael P. C. Watts, Ronald D. Voisin, and Sidlgata V. Sreenivasan as inventors, the entirety of which is incorporated by reference herein.

BACKGROUND OF THE INVENTION

1. Field of the Invention

The present invention relates to imprint lithography templates suitable for use in micro-fabrication of structures. The compliant template herein described has particular utility in pattern transfer onto non-planar surfaces.

2. Description of the Related Art

Micro-fabrication involves the fabrication of very small structures, e.g., having features on the order of micrometers or smaller. One industry that has been driving the fabrication of increasingly smaller structures is the electronics industry. As electronic devices have become smaller and faster, the integrated circuits that drive them have necessarily become smaller.

Lithographic techniques are usually employed in the manufacture of integrated circuits. Typically, these lithographic techniques include applying photosensitive materials to a semiconductor substrate. These photosensitive materials, commonly referred to as "resist," are selectively exposed to a form of radiation. An exposure tool and a photomask are often used to obtain the desired selective exposure. Such exposure changes the solubility of the resist such that the photomask's pattern is formed in the resist following a development process to remove the soluble resist.

Historically, exposure tools have been optical systems. However, optical systems are limited in their ability to resolve very small features. For example, the equation for resolution, where $\lambda$ is wavelength and NA is numerical aperture, is as follows:

$$RES = k_1 \lambda / NA$$

The resolution of ever-smaller features requires a reduction of wavelength, an increase in numerical aperture, or both. Of course, reducing wavelength significantly below 248 nm, currently used in deep UV lithography, is not trivial. Further, increasing numerical aperture results in a significant depth of focus loss, as shown in the following equation, where again $\lambda$ is wavelength and NA is numerical aperture:

$$DOF = k_2 \lambda / (NA)^2$$

Accordingly, optical lithography systems capable of printing microstructures may require a depth of focus so small as to be intolerant of slight wafer non-planarity, which commonly results from normal process variation. Therefore, due to slight wafer non-planarity, as well as the limitations of wavelength reduction, optical lithography is limited in its ability to print the sub-100 nm features that will be required for the manufacture of future integrated circuits.

Imprint lithography is capable of manufacturably producing sub-100 nm features. Several imprint lithography techniques have been investigated as low cost, high volume manufacturing alternatives to conventional photolithography for high-resolution patterning. In this emergent technology, a relief image in a template is used to replicate a surface relief into a polymerizable material arranged upon the surface of a substrate. The template makes mechanical contact with the material arranged upon the substrate, and the material is subjected to conditions to solidify and/or to polymerize the same such that a relief structure complimentary to that of the template is formed on the substrate. The material may be solidified or polymerized by, for example, heat or light. Such patterning and polymerization techniques may be referred to as thermal imprint lithography or ultraviolet ('UV') imprint lithography, respectively. Typical substrates may include semiconductors, dielectric materials, magnetic, or optoelectronic materials. Unlike optical lithography, resolution of imprint lithography is not limited by wavelength. However, imprint lithography may be limited by the ability to create high-resolution templates and the ability to transfer relief images on such templates. Consequently, templates with an ability to conform to non-planar surfaces are desired. Further, because lithography is typically the single largest component of integrated circuit fabrication cost, a template that may be used interchangeably for either UV or thermal imprinting is desired. It is desired, therefore, to provide an improved template for use in micro-fabrication.

SUMMARY OF THE INVENTION

In an embodiment of the present invention, the template is formed by forming a masking layer on a substrate; forming a pattern in the masking layer such that a portion of the substrate is exposed; etching one or more of the exposed portions of the substrate such that a relief image is formed in the substrate; removing the masking layer; coating the relief image with a release agent; depositing a conformal layer upon the substrate such that a portion of the conformal layer is arranged within the relief image formed in the substrate; arranging an elastomer layer on the conformal layer; arranging a substrate such that the elastomer layer is bonded between the conformal layer and the rigid substrate; and removing from the substrate the lithography template, where the lithography template includes the elastomer layer bonded between the rigid substrate and the conformal layer. In an exemplary embodiment, the template is formed by sequentially forming at least one elastomer layer on a substrate; forming an imprinting layer on the elastomer layer; forming a sacrificial layer on the imprinting layer; forming a masking layer on the sacrificial layer such that a portion of the sacrificial layer is exposed through the masking layer; etching one or more of the exposed portions of the sacrificial layer such that a portion of the imprinting layer is exposed through the masking layer; etching one or more of the exposed portions of the imprinting layer such that a relief image is formed; and removing the entire masking and sacrificial layers. These and other embodiments are herein described.

BRIEF DESCRIPTION OF THE DRAWINGS

The same reference numerals refer to the same parts throughout the various figures.

DETAILED DESCRIPTION OF PREFERRED EMBODIMENTS

Figure 1:
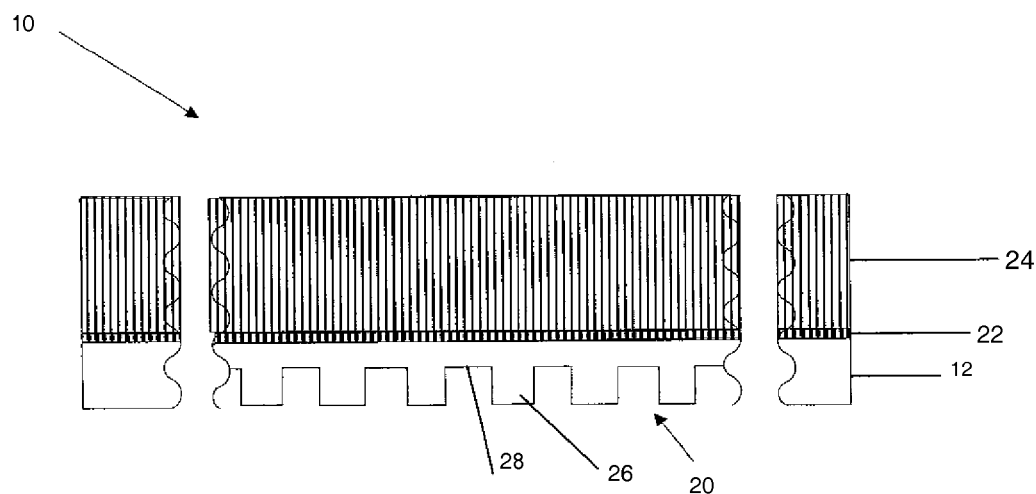
FIG. 1 is a cross-sectional view of an embodiment of the template of the present invention.

Referring to FIG. 1, a template 10 in accordance with an embodiment of the present invention includes an imprinting layer 12, having a relief image 20 therein, an elastomer layer 22 and a substrate 24. Elastomer layer 22 is disposed between imprinting layer 12 and substrate 24. Template 10 is designed for use an imprint lithography system wherein template 10 is urged into a formable material to imprint the same with a pattern that corresponds to relief image 20 for patterned material. The patterned material is subsequently solidified upon exposure to actinic radiation, e.g. ultraviolet radiation, thermal radiation and the like. An exemplary lithographic system is available under the trade name IMPRIO 100™ from Molecular Imprints, Inc., having a place of business at 1807-C Braker Lane, Suite 100, Austin, Tex. 78758. The system description for the IMPRIO 100™ is available at www.molecularimprints.com and is incorporated herein by reference. As a result, substrate 24, elastomer layer 22 and imprinting layer 12 may be transparent to actinic radiation.

Relief image 20 includes a plurality of spaced-apart recesses 28 and protrusions 26. In the present embodiment, recesses 28 are a plurality of grooves extending along a direction parallel to protrusions 26 that provide a cross-section of template 10 with a shape of a battlement. However, recesses 28 and protrusions 26 may correspond to virtually any feature required to create, for example, an integrated circuit. In an embodiment, the recesses and protrusions have a minimum feature size of 100 nm or less. As used herein, a "feature size" generally refers to a width, a length, and/or a depth of one of recesses 28, protrusions 26, or other geometries that comprise relief image 20.

During imprint lithography processes, template 10 is subjected to imprinting forces of several hundred pounds per square centimeter. As a result, it is desired that relief image be formed from a material that will undergo minimal undesired dimensional variations when subjected to imprinting forces. Exemplary materials from which imprinting layer 12 may be formed are glass, quartz, fused silica and the like.

Similarly it is desired that substrate 24 maintain substantial rigidity when subjected to imprinting forces. To that end, substrate 24 may be formed in whole, or in part, of silicon, silicon dioxide, silicon germanium carbon, gallium nitride, silicon germanium, sapphire, gallium arsenide, epitaxial silicon, poly-silicon, boron nitride, quartz, indium tin oxide or combinations thereof. In some embodiments, at least a portion of substrate 24 may be formed of $Sio_x$, where x is less than 2. For example, x may be about 1.5. The thicknesses of substrate 24 is selected so that the same undergoes little or no dimensional variations, e.g., compression, when subjected to imprinting forces.

It is desired that during imprinting processes, that relief image 20 be compliant with the topography of the surface being patterned. To that end, imprinting layer 12 is constructed in such a way as to be rendered compliant. For example, imprinting layer 12 may be provided with the requisite thickness so that the same is compliant in the Z-axis while having minimal dimensional variability in the axes orthogonal thereto, i.e., the X and Y-axes.

To facilitate the compliance of imprinting layer 12, elastomer layer 22 is formed from an appropriate material having an appropriate thickness to undergo deformation in the Z-axis when subjected to imprinting forces. Furthermore, it is desired that elastomer layer 22 have sufficiently suitable memory to return to an initial state in which it is subject to no imprinting forces, thereby obtaining its original shape when a deforming force is removed. Furthermore, the characteristics of elastomer layer 22 are preferably stable over the operational life of template 10. For example, elastomer layer 22 may be chosen to be resistant to degradation or deformation from repeated exposure to radiation and/or repeated mechanical stress.

The desired characteristics of imprinting layer 12 and elastomer layer 22 may be determined emperically. In an embodiment, the characteristics may be first estimated by modeling. For example, a 150 mm wafer may have a 4-5 micron bow from the center of the wafer to the edge of the wafer. Additionally, the wafer may have local surface height variation ranging from, for example, 50-100 nanometers peak-to-peak over a period of, for example, 2-4 mm. A template, which may have a imprinting area in the range of about 5 mm square to about 100 mm square and features less than about 100 nm, is preferably constructed such that its transferred relief image is not distorted by the non-uniformity of the wafer surface with mechanical contact to same. To prevent such distortion, the imprinting area is preferably conformal with the wafer's surface. To obtain the criterion for such a template, parameters such as those above may be input into a computer model. Template criterion may preferably be modeled for each individual processing layer and device, as typical non-uniformity may be process step dependent and/or device dependent. Through modeling and experimentation, the template components may be tuned to provide imprinting area deformation at the correct spatial frequency for removing surface non-planarity and enabling robust pattern transfer.

Figure 2:
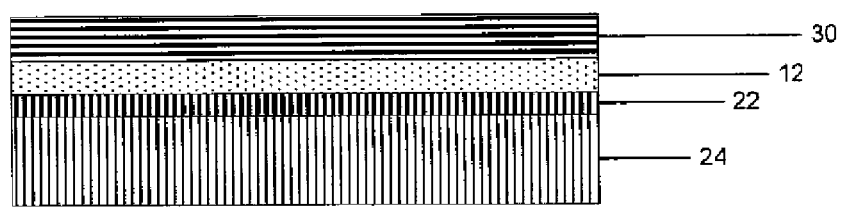
FIG. 2 is a cross-sectional view of a beginning step of an exemplary fabrication method of the template of the present invention.

The fabrication of an exemplary template 10 in accordance with an embodiment of the present invention is now discussed. In FIG. 2, exemplary processing layers are shown in cross-section. It is noted that relative layer thicknesses and structure sizes are not necessarily to scale. As noted above, template 10 comprises a planar substrate 24, which may be, for example, quartz. In an embodiment, substrate 24 may be actinic-radiation-transmissive. On a planar surface of substrate 24, elastomer layer 22 is applied. In an embodiment, substrate 24 is rigid compared to elastomer layer 22. As noted in further detail below, elastomer later 22 may be comprised of one or more viscoelastic materials, and adhesion promoters or other means to enhance adhesion between elastomer layer 22 and the layers adjacent thereto may be employed. In an embodiment, employment of additional adhesion promoters does not render the resultant template opaque.

Upon elastomer layer 22, imprinting layer 12 is arranged. Imprinting layer 12 may be applied using lamination, chemical vapor deposition (CVD), extrusion, spin processing, any combination thereof, or other means commonly known in the art. As an example, imprinting, actinic-radiation-transmissive layer 12 may comprise spin-on-glass or SOG which, as the name implies, is spun on from a liquid state.

Figure 3:
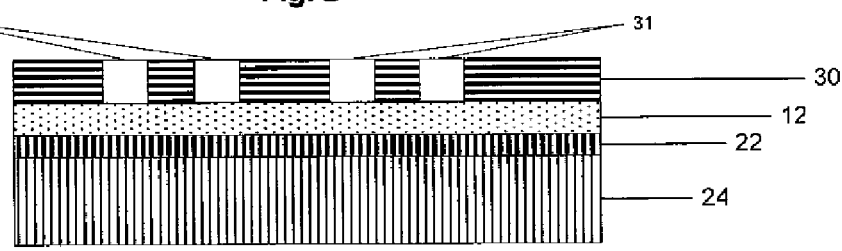
FIG. 3 is a cross-sectional view of a subsequent step of an exemplary fabrication method of the template of the present invention.
Figure 4:
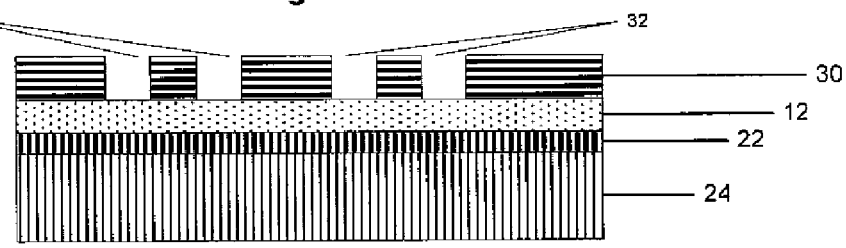
FIG. 4 is a cross-sectional view of a subsequent step of an exemplary fabrication method of the template of the present invention.
Figure 5:
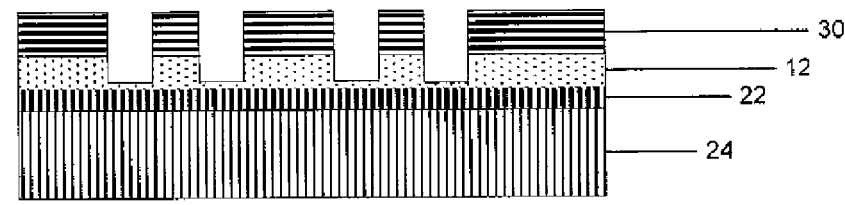
FIG. 5 is a cross-sectional view of a subsequent step of an exemplary fabrication method of the template of the present invention.

On imprinting layer 12, pattern-transferring layer 30 may be arranged. Such a pattern-transferring layer 30 may be a photosensitive layer such as photoresist, also known simply as 'resist.' When exposed, actinic radiation may render the photoresist soluble or insoluble depending on which type of resist is used. A pattern generation process exposes portions 31 of the resist, as illustrated in FIG. 3. In this example, the exposed portions 31 have been rendered soluble. Pattern generation processes may include, but are not limited to, optical systems, e-beam systems, laser systems, and ion systems, among others. A development process removes soluble photoresist, thus forming openings 32, as shown in FIG. 4. Through openings 32, imprinting layer 12 is exposed. As shown in FIG. 5, imprinting layer 12 can be etched while the remaining photoresist serves as a mask. As an example, imprinting layer 12 comprises quartz that may be etched using a fluorine etch chemistry ion in an Inductively Coupled Plasma (ICP). However, implant template fabrication may employ any etch process, dependent upon the etch rate desired and the underlying constituents that form the layer or layers to be etched. Exemplary etch processes may include plasma etching, reactive ion etching, chemical wet etching, and the like. Following the imprinting layer etch, pattern-transferring layer 30 may be stripped leaving the structure shown in FIG. 6. Thus, relief image 20, more clearly illustrated in FIG. 13, is formed in imprinting layer 12.

Figure 7:
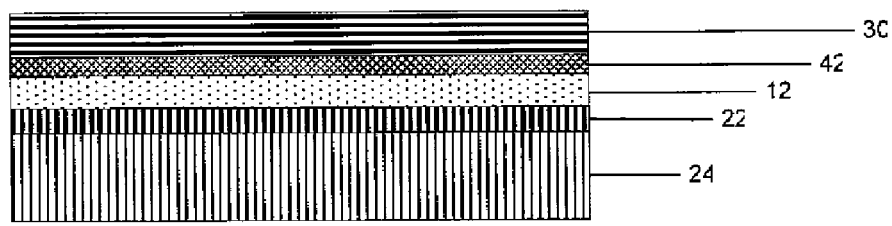
FIG. 7 is a cross-sectional view of a beginning step of an exemplary fabrication method of the template of the present invention.
Figure 8:
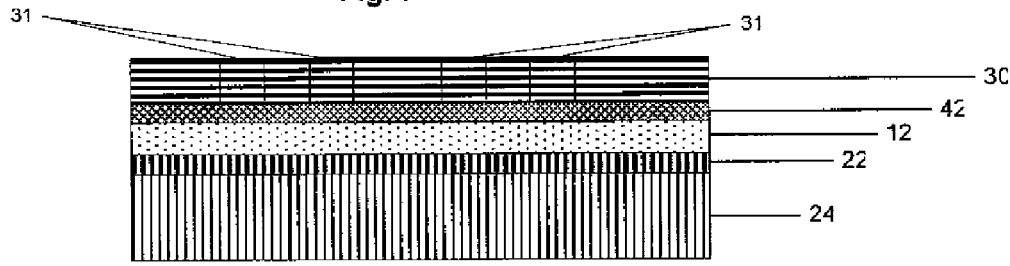
FIG. 8 is a cross-sectional view of a subsequent step of an exemplary fabrication method of the template of the present invention.
Figure 9:
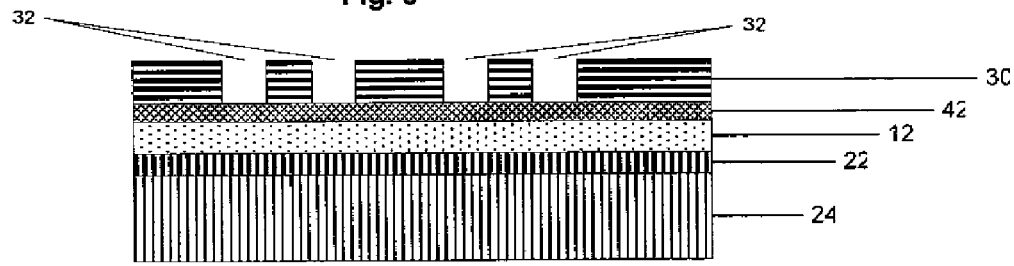
FIG. 9 is a cross-sectional view of a subsequent step of an exemplary fabrication method of the template of the present invention.
Figure 10:
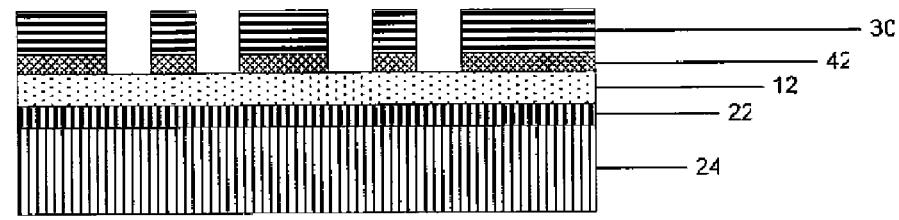
FIG. 10 is a cross-sectional view of a subsequent step of an exemplary fabrication method of the template of the present invention.

In an embodiment, an optional sacrificial layer 42 may be arranged between pattern-transferring layer 30 and imprinting layer 12, as shown in FIG. 7. Pattern-transferring layer 30 could be arranged on optional sacrificial layer 42 and patterned as described above. That is, as shown in FIG. 8, a pattern generation process exposes portions 31 of the resist, rendering portions 31 soluble. A development process forms openings 32, as shown in FIG. 9. Through openings 32, sacrificial layer 42 is exposed. As shown in FIG. 10, sacrificial layer 42 can be etched, while the remaining pattern-transferring layer 30 serves as a mask.

Figure 11:
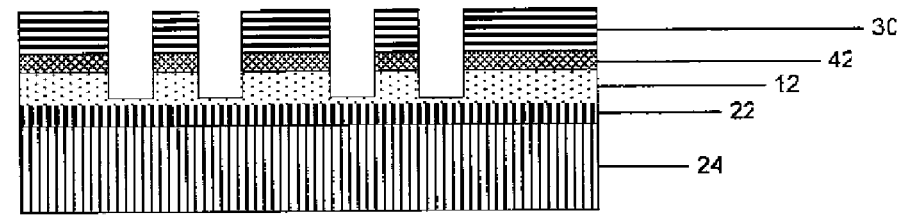
FIG. 11 is a cross-sectional view of a subsequent step of an exemplary fabrication method of the template of the present invention.
Figure 12:
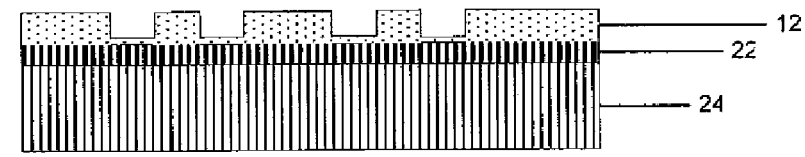
FIG. 12 is a cross-sectional view of a subsequent step of an exemplary fabrication method of the template of the present invention.

Sacrificial layer 42 may be chosen to have properties that may facilitate the template patterning process. As an example, sacrificial layer 42 may be conductive, thus facilitating e-beam patterning by providing a means to bleed charge. As another example, sacrificial layer 42 may have a chemistry chosen to enhance the subsequent etching of imprinting layer 12. Sacrificial layer 42 may have a composition which will improve the subsequent imprinting layer etch. Imprinting layer 12 is etched in FIG. 11. In an embodiment, when etched, sacrificial layer 42 may provide a desirable in situ surface treatment to relief image 20. Sacrificial layer 42 may be opaque, as in an embodiment it will ultimately be removed. For example, sacrificial layer 42 is removed in FIG. 12. Hence, in an exemplary embodiment, sacrificial layer 42 is preferably of a material that may be removed without damaging or otherwise permanently compromising the future functionality of relief image 20 within imprinting layer 12. Sacrificial layer 42 is preferably removed in its entirety from at least imprinting area 18 of imprinting, actinic-radiation transmissive layer 12. That is sacrificial layer 42 is preferably removed from at least the area of the template which necessarily contacts a material on a surface to replicate relief image 20 onto the surface.

Figure 13:
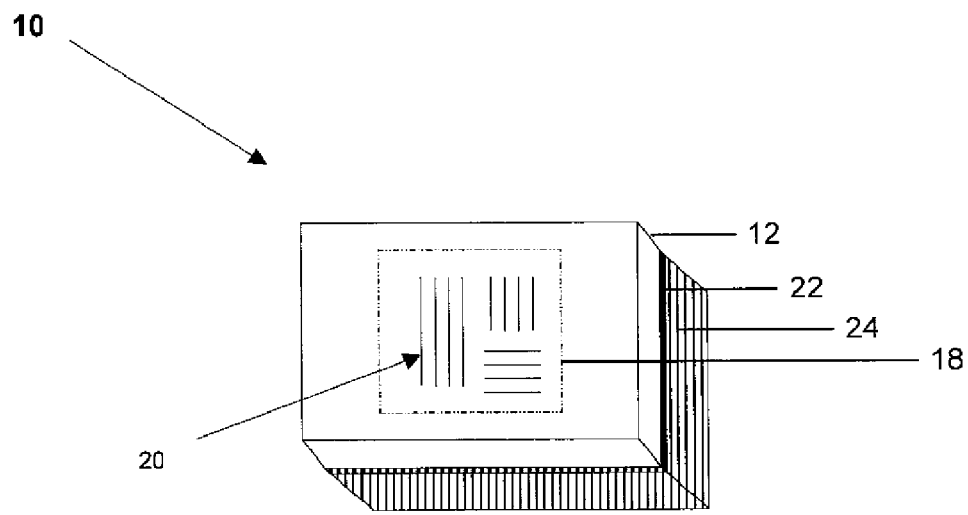
FIG. 13 is a plan view of an embodiment of the template of the present invention.
Figure 14:
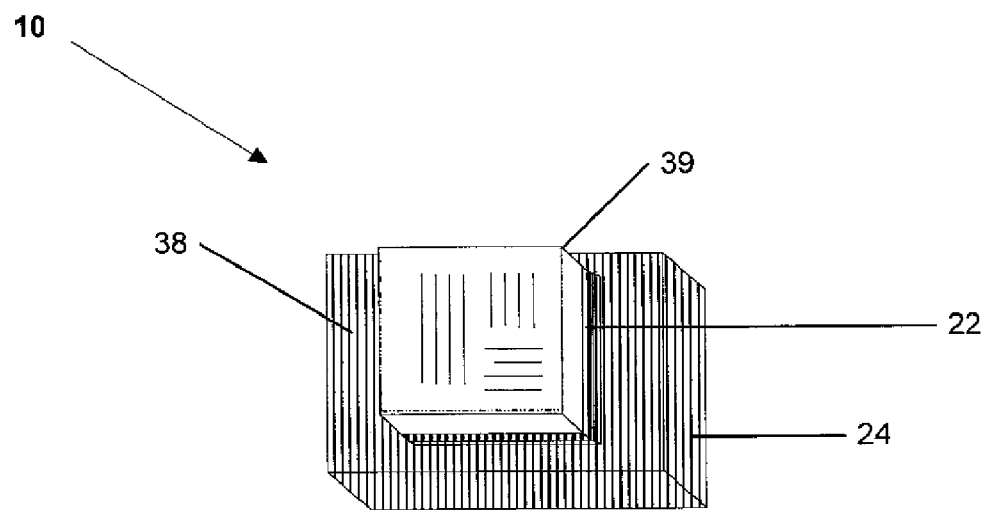
FIG. 14 is a plan view of an embodiment of the template of the present invention.
Figure 15:
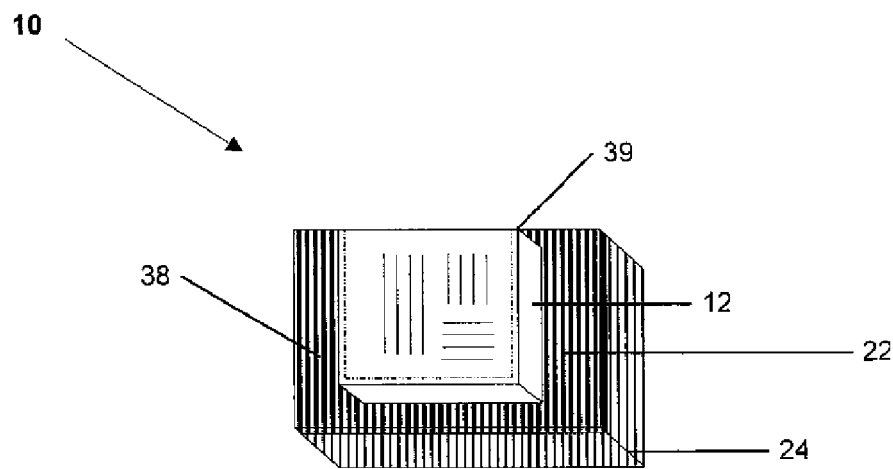
FIG. 15 is a plan view of an embodiment of the template of the present invention.
Figure 16:
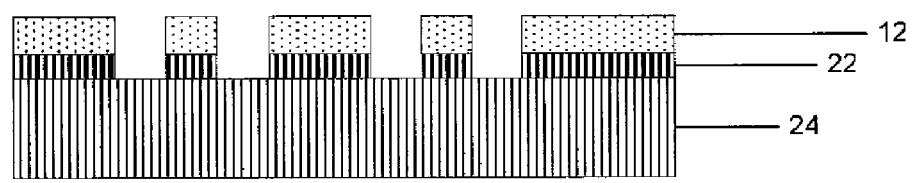
FIG. 16 is a cross-sectional view of an exemplary fabrication method of the template of the present invention.

A plan view of an exemplary template is shown in FIG. 13. Relief image 20 is etched into imprinting layer 12, which is spaced from substrate 24 by elastomer layer 22. Relief image 20 is arranged entirely within imprinting area 18. At this point in the processing, it may be desirable to etch template 10 such that imprinting area 18 is a level spaced distance above the peripheral substrate 38, as shown in FIG. 14. In particular, imprinting area 18 is atop 'mesa' 39. Relief image 20 is arranged entirely within imprinting area 18. Mesa 39 may be created as follows. After relief image 20 has been etched into template 10 and any masking layers removed, the template is again coated with pattern-transferring layer 30. This photosensitive layer covers an entirety of template 10, including relief image 20. The perimeter of peripheral substrate 38, that area extending from a periphery of imprinting area 18 towards the periphery of template 10, is exposed and etched. In this manner, a raised area, or 'mesa' 39, within peripheral substrate 38 is formed. Following the perimeter etch, the photoresist is removed from mesa 39. The resultant template 10 comprises relief image 20 arranged upon a raised mesa 39. In an embodiment, mesa 39 has a height of less than about 15 μm. However, the height of mesa 39 may vary.

Figure 6:
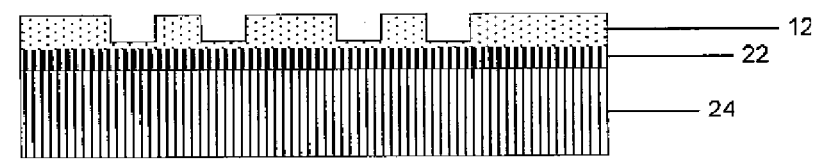
FIG. 6 is a cross-sectional view of a subsequent step of an exemplary fabrication method of the template of the present invention.

Depending upon the thickness of the material used for imprinting layer 12, mesa 39 may include elastomer layer 22, as shown in FIG. 5. That is, the perimeter etch employed to create mesa 39 may also etch through elastomer layer 22 and into rigid substrate 24. In an embodiment, such exposed elastomer sidewalls commensurate with mesa 39 sidewalls may be desirable. In an alternate embodiment, it may be desirable to choose an imprinting layer thickness and mesa 39 height that will leave elastomer layer 22 intact. That is, it may be undesirable to create exposed elastomer sidewalls commensurate with mesa 39 sidewalls. In such an embodiment, such periphery is etched such that only imprinting layer 12 is removed, leaving at least a portion of the elastomer peripheral to mesa 39, as shown in FIG. 6.

Described above are embodiments of the fabrication of a compliant template 10 comprising a rigid substrate 24, elastomer layer 22, and imprinting layer 12 where these template components are integral at the time of relief image patterning. However, in an embodiment, the thickness of imprinting layer 12 may be changed following relief image patterning. The thickness of imprinting layer 12 may be reduced by, for example, etching, cleaving, polishing, or otherwise removing a portion of the above-described first substantially planar side of imprinting layer 12. Following the creation of relief image 20, the thickness of imprinting layer 12 is adjusted to a compliant thickness that, in a preferred embodiment, is determined experimentally. Once imprinting layer 12 is adjusted to a compliant thickness, imprinting layer 12 is arranged upon substrate 24 such that an elastomer is arranged between the imprinting layer and rigid substrate 24. In an embodiment, elastomer layer 22 is less rigid than substrate 24. In an embodiment, substrate 24, elastomer layer 22, and imprinting layer 12 transmit actinic radiation. In various embodiments, elastomer layer 22 may be arranged upon substrate 24 in any one of a number of methods as discussed above.

In an alternate embodiment, an inverse relief image is etched into a master from which any number of templates may be subsequently constructed. Consequently, such a master may be constructed from an opaque material, or such a master may be comprised of any of the above materials that may be suitable for a substrate. The master material may be chosen for its ability to be patterned, and its subsequent ability to provide a mold from which templates may be constructed. In an embodiment, a master is constructed from a quartz substrate.

Necessarily, a master from which templates are constructed contains an inverse of the desired template pattern. To create a template having the desired pattern from such a master, a conformal imprinting layer is arranged commensurate with that surface of the master which contains the inverse relief image. Such a surface may be coated with a release agent prior to the arrangement of the imprinting layer. An exemplary release agent is disclosed in U.S. patent application Ser. No. 10/375,382, filed Feb. 27, 2003, entitled "Composition and Method to Form a Release Layer," which is assigned to the assignee of the present invention and is incorporated by reference in its entirety herein. In an exemplary embodiment, imprinting layer 12 is not only conformal, but also actinic-radiation-transmissive. The actinic-radiation-transmissive conformal layer may be spun on or deposited via, for example, chemical vapor deposition, or created by any other means commonly known in the art. A transmissive elastomer is arranged on the imprinting layer. A rigid, actinic-light-transmissive substrate is arranged on the elastomer. Adhesion promoters or other means to prevent future delamination of the layers of the template may be employed. Subsequently, a light-transmissive template comprising a rigid substrate, an elastomer, and a conformal layer may be removed from the master.

Described above are embodiments of the fabrication of a compliant template that contemplate creating relief image 20 by removing a portion of imprinting layer 12. However, in an embodiment, imprinting layer 12 may be created by deposition. That is, imprinting layer 12 may be created by, for example, focused ion beam deposition of imprinting layer 12 such that relief image 20 is formed in situ. Imprinting layer 12 may be deposited on embodiments of above-described elastomer layer 22 and rigid substrate 24.

Described above are embodiments of the fabrication of a compliant template that contemplate elastomer layer 22 extending continuously throughout imprinting area 18. However, in an embodiment, a template having elastomer layer 22 that does not extend continuously through imprinting area 18 may be desired. That is, elastomer layer 22 having elastomer features which have a one-to-one correlation with the actinic-radiation-transmitting features which comprise imprinting layer 12 may be desirable. Such a template could be designed to be very compliant. Such a template could be constructed, for example, by patterning a thin-light transmissive layer, where the thin light-transmissive layer is arranged on elastomer layer 22, and where elastomer layer 22 is arranged on rigid substrate 24. When the thin light-transmissive layer is etched, elastomer layer 22 may also be etched such that the individual relief features are comprised of a light transmissive portion and an elastomer portion, as shown in FIG. 7.

Elastomer layer 22 chosen for the embodiments herein may be comprised of one or more materials having viscoelastic properties. In particular, elastomer layer 22 may comprise one or more layers of viscoelastic material. Each material used to form elastomer layer 22 may be applied independently. In an embodiment, the elastomer is substantially transparent to actinic light, e.g., ultraviolet light. The viscoleastic material(s) may be chosen according to their physical properties. For example, properties which may be of interest are actinic light transmissivity, solvent and/or chemical resistance, adhesion, wetability, resistivity to degradation, conductivity, Poisson's ratio, and others. In an exemplary embodiment, the elastomer is polydimethylsiloxane, or PDMS.

The properties of PDMS may vary according to the amount of cross-linking present, which may be varied by altering the composition of the PDMS. PDMS has a relatively high coefficient of thermal expansion. Consequently, special consideration may be taken for a template made from PDMS and contemplated for UV imprinting, as well as thermal imprinting. For example, a thermal imprint system that applies heat from a semiconductor wafer substrate in order to crosslink polymerizable material arranged on a wafer surface may be considered. An exemplary thermal imprint system is disclosed in U.S. patent application Ser. No. 10/753,384, filed Jan. 15, 2004, entitled "Thermal Processing System for Imprint Lithography," assigned to the assignee of the present invention, and which is incorporated by reference herein in its entirety. The elastomer PDMS may be used in conjunction with at least one additional elastomer. The elastomers may be chosen with physical properties that interact for a desired result. For example, the differing coefficients of thermal expansion, differing Poisson's ratios, or differing adhesive properties may determine which materials comprise elastomer layer 22. The arrangement of such materials may also be thusly determined. In an embodiment, adhesion promoters may also be used in elastomer layer 22. For example, PDMS may employ an additional adhesion promoter, as PDMS is somewhat hydrophobic. In an embodiment, additional processing may occur between or commensurate with the application of the layers comprising elastomer layer 22. For example, the PDMS surface may be oxidized to improve adhesion.

In an embodiment, fluoridated rubbers may be used for the elastomer instead of or in addition to PDMS. As shown in FIG. 6, it may be desirable to construct a template having a transmissive rigid substrate having elastomer layer 22 thereupon, where the patterning layer is arranged such that rigid substrate 24, as well as elastomer layer 22, extends around the periphery of the patterning layer. That is, leaving an area around imprinting area 18 exposed. In such a case, resilient elastomer may be desirable. Fluoridated rubbers may be chosen for their resilient properties. For example, Kalrez™ is a material made of perfluore rubber, which can withstand oxygen plasma or oxygen/$CF_4$ plasma etches. Fluoridated rubbers may be desirable for their resistance to acid and solvent corrosion, as well as a wide range of chemicals, even at high temperatures. As another example, Viton™ is a material made of fluoridated rubber that may withstand temperatures from about −15° C. up to about 280°

C. An elastomer having such resilience to high temperatures is desirable when contemplating a dual-purpose template. That is, a template that may be used interchangeably for either UV or thermal imprint lithography applications. However, resistance to a wide range of chemicals is also important when considering applications for the instant invention.

The complimentary relief images formed on wafer surfaces as discussed above are typically sacrificial layers. That is, the relief images are applied to facilitate the patterning of one or more device layers arranged below the sacrificial relief image, and the sacrificial relief image is typically removed in its entirety following the patterning of said device layer(s). However, the improved template and the associated imprint techniques herein described are not necessarily limited to creating sacrificial layers. The improved template may be used for applications wherein a functional device layer is created directly from the relief image. Creating a device layer directly from a relief image could eliminate steps in the manufacturing process of an integrated circuit, thus desirably reducing the manufacturing cycle time. Such device layer creation would eliminate processing steps needed to create and to remove a patterned sacrificial layer. Such imprint device layer creation would preferably employ processing fluids that form functional device features upon imprinting and curing. For example, interconnects for an integrated circuit could be formed directly if an imprint template configured to form interconnect structures was used in conjunction with a conductive imprint relief material, thus forming conductors upon curing. Such a process could be used to create interconnects without the need for a sacrificial patterning layer. In addition to conductive layers, other imprint relief materials may be curable to form semiconductive layers, dielectric layers, and/or a layer having a desired mechanical, hermetic, or optical property.

As noted above, an objective of the instant invention is to provide a compliant template to be used with imprint lithography. As described above, an embodiment of the template contemplated herein is constructed having characteristics that enable conformality between a template and a patterning surface, thus ensuring an accurate transfer of the relief image from one imprint to the next. However, it is noted that the present invention also contemplates an embodiment that advantageously transfers an altered relief image. In an embodiment, the compliant template may be constructed such that the Poisson's ratio enables the template to advantageously alter, thus forming features having dimensions smaller than what can be patterned using leading-edge patterning systems, such as, for example, e-beam pattern generators. In such an embodiment, templates may be created using a plurality of elastomers having both positive and negative Poisson's ratios. Such a template may include elastomer layer 22 comprised of a plurality of elastomers arranged such that the imprinting layer above such elastomer layer 22 has imprinting features that are each affected only by the deformation of a single corresponding elastomer. In an embodiment, it may be desirable to create numerous partial templates for a single processing layer. Such a partial template would transfer only a portion of the features of the processing layer. Thus multiple imprinting steps for a single processing layer could be employed. For example, a first template could imprint the horizontal features, and a second template could imprint the vertical features. Such a process would enable the use of a single deformable elastomer per template. In yet another embodiment, a template having imprinting layers with viscoelastic properties is contemplated. Such a template may employ an elastomer layer that can be patterned, thus obviating the need for an additional imprinting layer. Such a template could also be designed to advantageously alter the imprint features, thus producing even smaller geometries than can be patterned onto a template.

While preferred embodiments of the compliant template have been described in detail, it should be apparent that modifications and variations thereto are possible, all of which fall within the true spirit and the scope of the invention. With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention. For example, any suitable elastomer may be used instead of the PDMS described. Also, the imprinting layer may be any suitable material other than SOG. In fact, the imprinting layer may be eliminated altogether in the presence of a patternable elastomer. And although patterning features less than about 100 nm have been described, it should be appreciated that the compliant template herein described is also suitable for patterning any size features as may be required in the fabrication of, for example, an integrated circuit. Furthermore, a wide variety of materials may be used in the fabrication of the template herein described instead of the materials noted. Materials and methods may be chosen in accordance with their abilities to fabricate a template which may be optically transparent and conformal to a surface; and/or which may be used for two or more types of imprint lithography; and/or which may used to create features directly without the use of a sacrificial layer; and/or which may advantageously alter a relief image therein upon use, thus enabling ever-smaller feature sizes.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. A method of forming a lithography template, said method comprising:
   positioning an elastomer layer on a body;
   positioning an imprinting layer on said elastomer layer such that said elastomer layer is positioned between said body and said imprinting layer;
   positioning a masking layer on said imprinting layer such that said imprinting layer is positioned between said masking layer and said elastomer layer, with a portion of a layer adjacent said masking layer being exposed through said masking layer;
   etching said portion of said imprinting layer such that a pattern is formed in said imprinting layer;
   removing said masking layer; and
   with said elastomer layer being configured to alter a portion of said pattern.

2. The method as recited in claim 1, wherein said imprinting layer comprises an imprinting area, wherein said pattern is positioned entirely within said imprinting area, and wherein an entirety of said imprinting area transmits actinic radiation.

3. The method as recited in claim 1, wherein said elastomer transmits actinic radiation.

4. The method as recited in claim 1, wherein said body transmits actinic radiation.

5. The method as recited in claim 1, wherein said imprinting layer is adapted to be conformal with a wafer surface.

6. The method as recited in claim 1 further comprising positioning an additional masking layer on said etched imprinting layer such that a rectangular imprinting area circumscribing said pattern is masked; and etching a periphery of said pattern such that an entirety of an etched surface of said periphery is a spaced distance from a surface of said imprinting area.

7. The method as recited in claim 6, wherein etching said periphery comprises etching into said body.

8. The method as recited in claim 7, further comprising:
positioning a sacrificial layer on said imprinting layer such that said imprinting layer is positioned between said elastomer layer and said sacrificial layer, and such that said sacrificial layer is positioned between said masking layer and said imprinting layer; and
etching said portion of said sacrificial layer such that a portion of said imprinting layer is exposed through said masking layer, wherein etching said sacrificial layer proceeds etching said imprinting layer and wherein removing said masking layer further comprises removing said sacrificial layer.

9. The method as recited in claim 8, wherein said sacrificial layer is conductive.

10. The method as recited in claim 1 wherein a plurality of portions of said layer are exposed and with etching further including etching said plurality of portions of said imprinting layer.

11. The method as recited in claim 1 with said elastomer layer further being configured to alter a portion of said pattern in a first direction while minimizing dimensional variability in a second direction orthogonal to said first direction.

12. The method as recited in claim 1 with said elastomer layer further being configured to alter a portion of said pattern in response to a force while having suitable memory to return to an initial state in an absence of said force.

* * * * *